United States Patent [19]

Matsuda et al.

[11] Patent Number: 5,075,623
[45] Date of Patent: Dec. 24, 1991

[54] METHOD FOR MEASURING THREE-DIMENSIONAL SPATIAL MAGNETIC FIELD DISTRIBUTION USING ALGEBRAIC RECONSTRUCTION AND CONVERGENCE

[75] Inventors: Jinichi Matsuda; Yasuyuki Kondoh, both of Nagaoka; Koichi Mukasa, Sapporo; Akihiro Inada, Nagaoka; Masahiro Iizuka, Sapporo; Kinya Aoyagi, Yoita, all of Japan

[73] Assignee: Alps Electric Co., Ltd., Tokyo, Japan

[21] Appl. No.: 508,392

[22] Filed: Apr. 12, 1990

[30] Foreign Application Priority Data

Aug. 31, 1989 [JP] Japan .................................. 1-225558
Aug. 31, 1989 [JP] Japan .................................. 1-225559

[51] Int. Cl.⁵ ........................ G01R 33/02; G06G 7/48
[52] U.S. Cl. .................................... 324/250; 364/578
[58] Field of Search ............. 324/244, 250, 260, 71.3, 324/72, 158 P, 501; 250/310, 311; 364/481, 550, 578

[56] References Cited

U.S. PATENT DOCUMENTS 4,803,430 2/1989 Shinada et al. ..................... 324/250

FOREIGN PATENT DOCUMENTS 189036 11/1966 U.S.S.R. .............................. 324/250
437989 2/1975 U.S.S.R. .............................. 324/250

OTHER PUBLICATIONS

IEEE Trans. Mag. vol. Mag-20 No. 5, pp. 866-868, Sep. 1984 "Profiling of Micromagnetic Stray Fields in Front of Magnetic Recording Media and Heads by Means of a SEM", by J. B. Elsbrock et al.
IEEE Trans. Mag. vol. Mag-21 No. 5, pp. 1593-1595, Sep. 1985 "Evaluation of Three-Dimensional Micromagnetic Stray Fields by Means of Electron-Beam Tomography", by J. B. Elsbrock et al.
Thornley, R. F. M., Mapping an AC Magnetic Field IBM Tech. Discl. Bull., vol. 12, No. 6, Nov. 1969, pp. 810, 811.

Primary Examiner—Gerard R. Strecker
Attorney, Agent, or Firm—Guy W. Shoup; B. Noel Kivlin

[57] ABSTRACT

The present invention relates to a method for measuring three-dimensional spatial magnetic field distributions used particularly in measuring the magnetic field distribution in a small spatial region such as a leakage magnetic field of a magnetic head and the object thereof is a measuring method capable of measuring a high frequency magnetic field in the small spatial region with a high precision.

1 Claim, 6 Drawing Sheets

COMPARISON OF RECONSTRUCTED MAGNETIC FIELD
DISTRIBUTION AND THEORETICAL MAGNETIC FIELD
DISTRIBUTION (RECTANGULAR 1 TURN COIL)

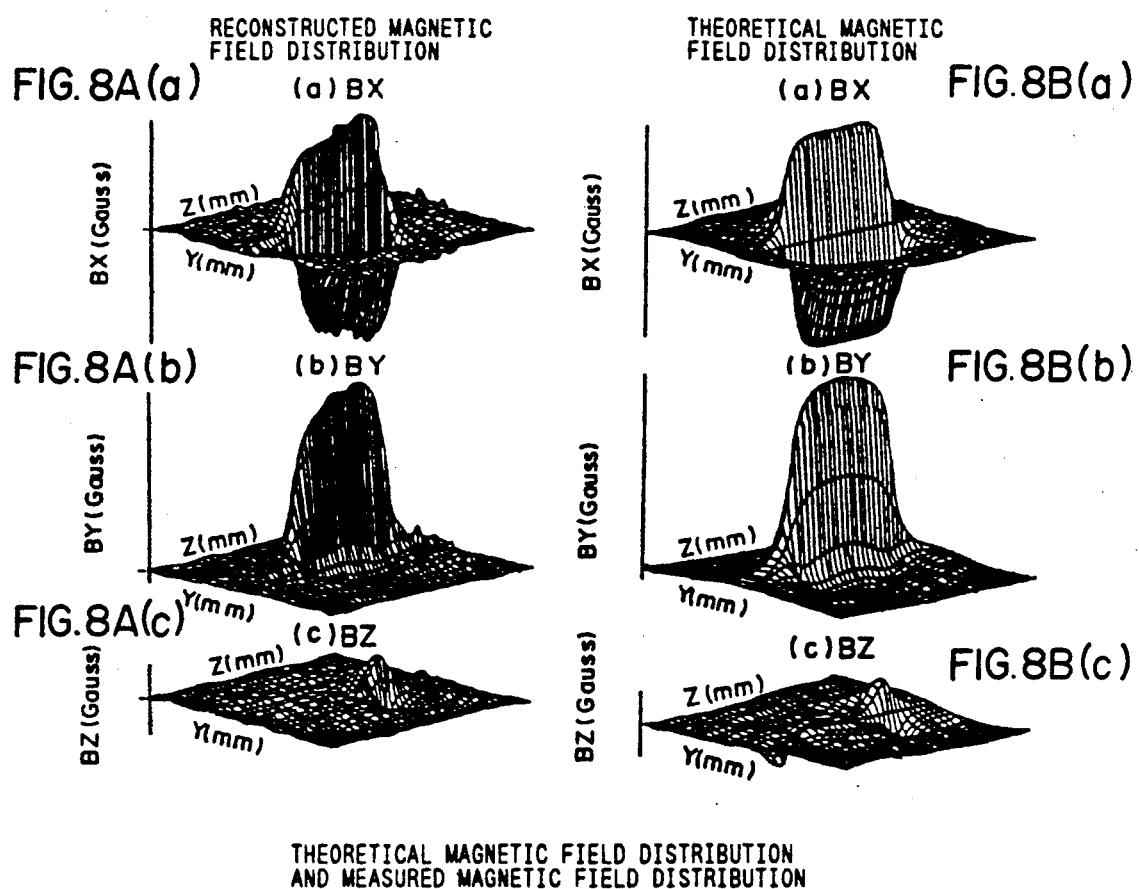
THEORETICAL MAGNETIC FIELD DISTRIBUTION
AND MEASURED MAGNETIC FIELD DISTRIBUTION
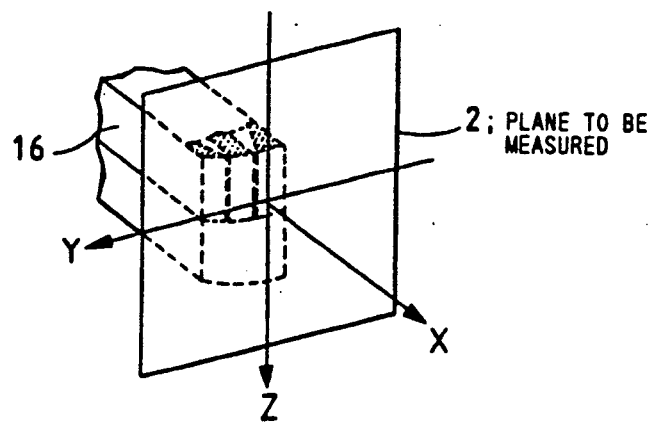
FIG. 9

MEASURED MAGNETIC FIELD DISTRIBUTION BX (X=200(μm))

MEASURED MAGNETIC FIELD DISTRIBUTION BY (X=200(μm))

MEASURED MAGNETIC FIELD DISTRIBUTION BZ (X=200(μm))

70μm 100μm GAP

RECONSTRUCTED MAGNETIC FIELD DISTRIBUTION OF ERASING HEAD

METHOD FOR MEASURING THREE-DIMENSIONAL SPATIAL MAGNETIC FIELD DISTRIBUTION USING ALGEBRAIC RECONSTRUCTION AND CONVERGENCE

BACKGROUND OF THE INVENTION

The present invention relates to a method for measuring three-dimensional spatial magnetic field distributions, which is useful for measuring a high magnetic field distribution in a small spatial region such as a leakage magnetic field of a magnetic head.

In magnetic recording, since the leakage high frequency magnetic field distribution of a micron order in the neighborhood of the gap of a magnetic head is a factor determining recording/reproduction characteristics, with increasing recording density and improvement in the quality in recent years, it becomes more and more inevitable in the development of magnetic heads to take into account the three-dimensional spatial leakage high frequency magnetic field distribution. Further, in recent years, attention is paid to microscopic dynamic response of the magnetic domain structure in thin film magnetic substances and it is thought that the three-dimensional measurement is necessary also for evaluating it.

As a method for measuring the magnetic field distribution of micron order, recently a method, so-called electron beam tomography, has been proposed, by which the magnetic field distribution is reconstructed three-dimensionally by the tomographic method, starting from the magnitude of deviation of an electron beam after the passage through the magnetic field region, using the deviating action due to the Lorenz force of the magnetic field acting on the electron beam, and computer simulation results on a simple model have been reported ("Evaluation of Three-Dimensional Micromagnetic Stray Fields by Means of Electron-Beam Tomography", IEEE Trans. Magn., MAG-21, 5, pp. 1593, 1594 (1985)).

By the method of the electron beam tomography relating to the proposition described above, in order to divert the linear reconstruction method used for the X-ray CT (computer tomographic method), the Trajectory of an electron in the magnetic field is approximated by a straight line.

SUMMARY OF THE INVENTION

Although plausible results have been obtained by the prior art electron beam tomographic method for the measurement of static magnetic field, it is unsuitable for the measurement of high frequency strong magnetic fields having considerable influences on the dynamic characteristics of a magnetic field device.

Further, in the case where the object to be measured is a strong magnetic field, and in addition, the intensity thereof varies rapidly, the non-linearity of the electron trajectory in the magnetic field cannot be neglected. Consequently the linear approximation method has a problem in precision.

For this reason, it was desired to establish a method for measuring a three-dimensional high frequency strong magnetic field distribution.

The present invention has been done in view of the situations described above and the object thereof is to provide a method for measuring three-dimensional magnetic field distribution capable of measuring a high frequency magnetic field distribution in a small spatial region with a high precision and a method for measuring three-dimensional magnetic field distribution capable of measuring the three-dimensional distribution of a spatial magnetic field with a higher precision than the prior art method by adopting a non-linear reconstruction method, taking a curved electron trajectory into account.

In order to solve the problem concerning the measurement of a high frequency strong magnetic field (hereinbelow called the former), the present invention is characterized in that a measurement space, where the distribution of a high frequency magnetic field is to be measured, is irradiated with an electron beam and the magnitude of deviation of the electron beam stated above after the passage through the space stated above is measured in synchronism with the high frequency magnetic field stated above, the high frequency magnetic field stated above being evaluated on the basis of measurement results of the magnitude of deviation stated above.

In order to solve the problem concerning the measurement, whose object is a strong magnetic field varying rapidly in the intensity (hereinbelow called the latter), the present invention is characterized in that (a) a reference axis is selected in a measurement space, in which the magnetic field distribution is to be measured and several planes to be measured, which are perpendicular to the reference axis stated above, are set in the measurement space; (b) an electron beam moving in the extended planes of the planes to be measured switched over one after another is to made to enter the relevant plane to be measured with predetermined various incident angles and the magnitude of deviation of the electron beam due to the action of the magnetic field distributed in the relevant plane to be measured is measured successively; (c) the magnetic field distributed in the relevant plane to be measured is evaluated on the basis of measured results; (d) the trajectory of the electron beam is calculated to obtain the magnitude of deviation by using the results thus evaluated, in the case where the electron beam enters the relevant plane to be measured under the same conditions as those at the measurement of the magnitude of deviation described above; (e) the difference in the magnitude of deviation of the electron beam is calculated between the measured results and the corresponding results of calculation; and (f) the magnetic field thus evaluated is repeatedly corrected on the basis of the difference described above, until the difference described above is decreased below a value previously set.

BRIEF DESCRIPTION OF THE DRAWINGS

FIGS. 8A(a-c) and 8B(a-c) show the corresponding magnetic field distributions of the rectangular one-turn coil obtained by measuring experiments;

FIG. 9 is a scheme indicating the outline of the construction of an erasing head used in the measuring experiments;

DETAILED DESCRIPTION OF THE INVENTION

EMBODIMENT 1

Figure 1:
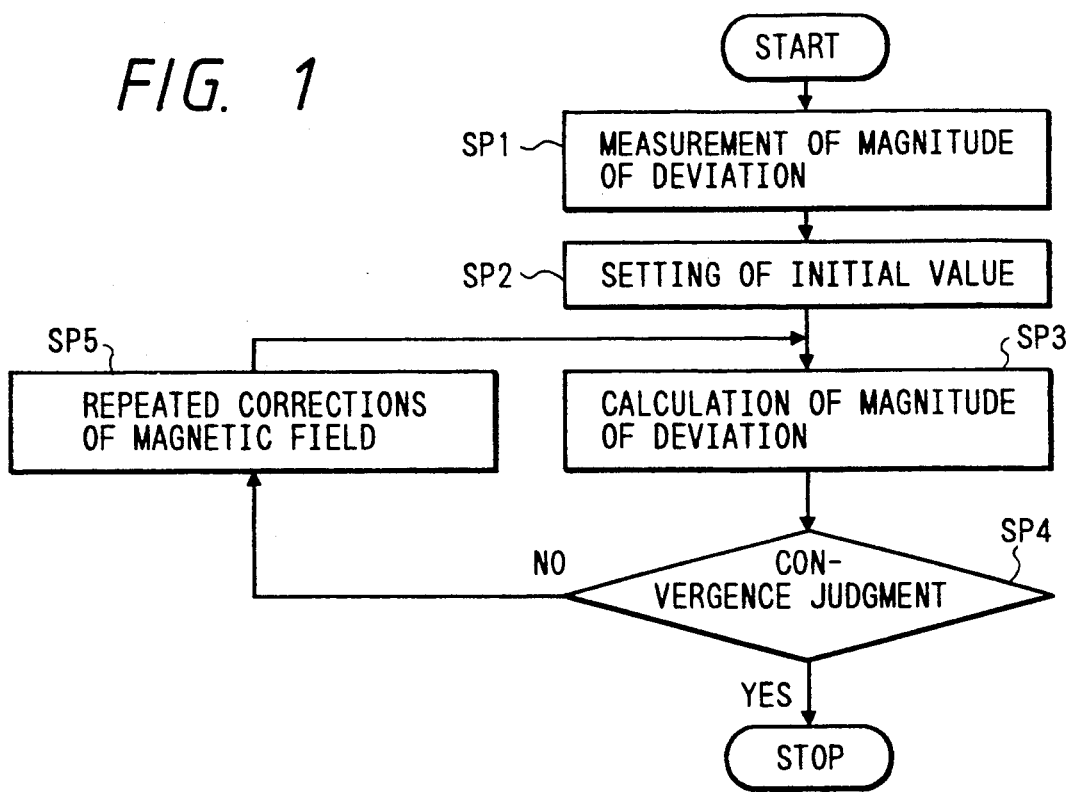
FIG. 1 is a flow chart indicating the flow of the method for measuring three-dimensional spatial magnetic field distribution according to an embodiment of the present invention.

Hereinbelow the first embodiment of the present invention will be explained, referring to the drawings.

FIG. 1 is a flow chart indicating the flow of the method for measuring a three-dimensional high frequency magnetic field according to an embodiment of the present invention.

As indicated in the figure, the three-dimensional measuring method in this example consists of a step of measuring the magnitude of deviation of an electron beam (Step SP1) and a process of reconstructing a high frequency magnetic field distribution by using measured magnitudes of deviation (Steps SP2 to SP5). (A) Measurement of magnitude of deviation At first, the method for measuring the magnitude of deviation of the electron beam according to the present embodiment will be explained.

Figure 2:
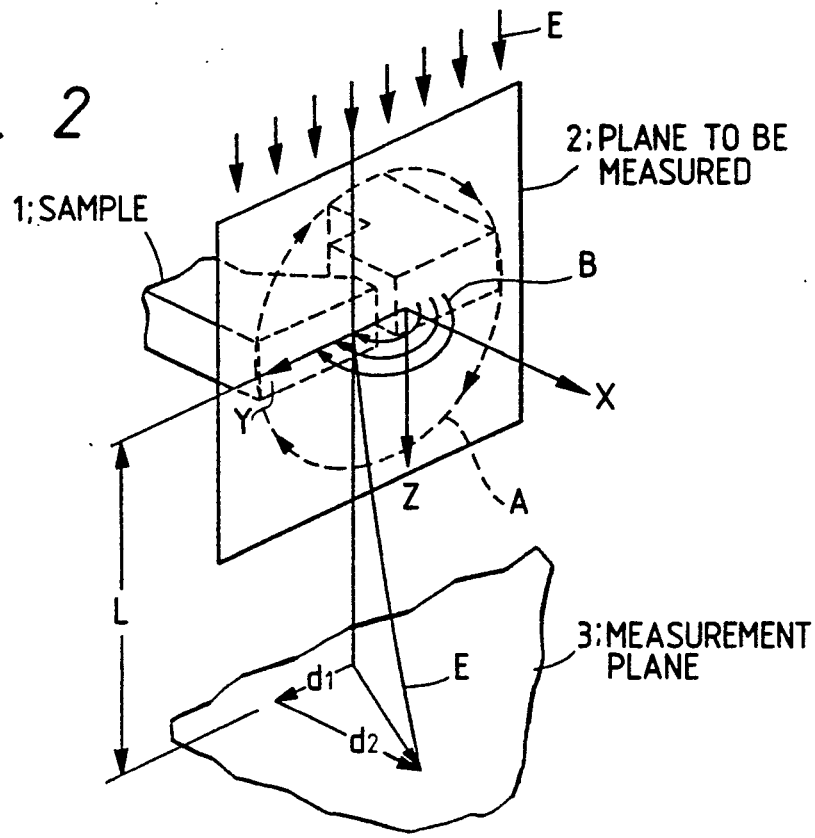
FIG. 2 is a scheme indicating the principle of the method for measuring three-dimensional spatial magnetic field distribution according to the present invention.
Figure 3:
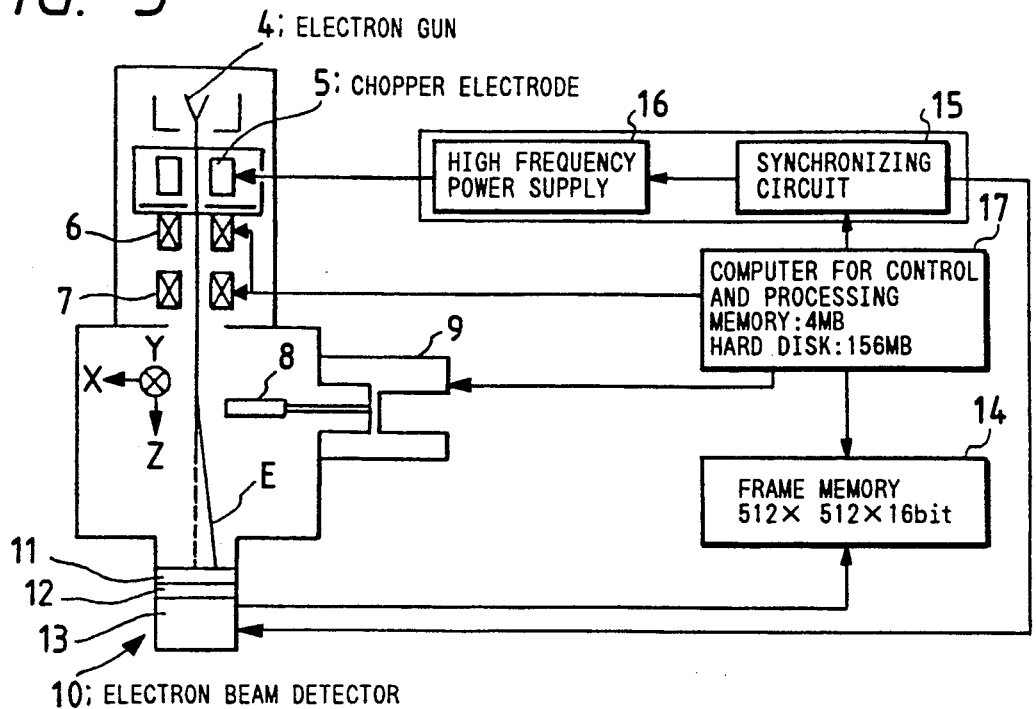
FIG. 3 is a scheme indicating the outline of the construction of a measuring system applied to the embodiment indicated in FIG. 1.

FIG. 2 is a scheme indicating the principle of the three-dimensional measuring method according to the present invention (principle of the electron beam tomography), in which reference numeral 1 is a sample such as a magnetic head; 2 is a plane to be measured, where the high frequency magnetic field (leakage magnetic field B from the sample 1) is measured; and 3 is a measurement plane, where the magnitude of deviation of the electron beam is measured. The plane to be measured 2 is scanned with the electron beam E and vectors representing the magnitude of deviation $(d_1, d_2)$ on the measurement plane 3 are measured and stored. This process is completely identical to the prior art Lorenz method described previously. Next, an identical measurement is effected again after having rotated the sample 1 around an X axis perpendicular to the plane to be measured 2 (in the direction indicated by an arrow A) by a small angle. This procedure is repeated, until the sample 1 is rotated by 180°. When the measurement and the storage of these deviation magnitude data are terminated, the plane to be measured 2 is displaced in the X direction, the procedure identical to that described above is repeated for the new plane to be measured 2. The three-dimensional magnetic field distribution can be measured by effecting such two-dimensional measurements for a necessary number of planes to be measured. FIG. 3 is a scheme indicating the outline of the construction of a measuring system applied to the three-dimensional measuring method in this embodiment, in which reference numeral 4 is an electron gun emitting the electron beam E; 5 is a chopper electrode generating the high frequency pulsed electron beam E by interrupting the emission of the electron beam; 6 is a deflecting coil, which deflects the electron beam E in the X direction; 7 is a deflecting coil, which deflects the electron beam E in the Y direction; 8 is a sample such as a magnetic head; 9 is a four-axis fine movement device which rotates and translates parallelly the sample; and 10 is an electron beam detector for measuring the magnitude of deviation of the electron beam E. This electron beam detector 10 is composed of an MCP (microchannel plate) 11, a fluorescent plate 12 and an SIT camera 13 (high sensitivity television camera). The MCP 11 is an assembly of photomultipliers. When the electron beam is injected therein, electrons are multiplied and projected to the fluorescent plate 12 located under an amplified electron image to produce a spot. Furthermore, the spot is imaged by the SIT camera 13 (high sensitivity television camera). 14 is a frame memory, which takes-in the spot stated above imaged by means of the SIT camera 13 as image data and stores them. Reference numeral 15 is a synchronizing circuit and 16 is a high frequency power supply. The synchronizing circuit 15 stated above is a circuit for synchronizing the output of the high frequency power supply with the detection output of the electron beam detector 10. The high frequency power supply 16 sends a signal for generating a high frequency pulsed electron beam E to the chopper electrode 5.

Figure 4:
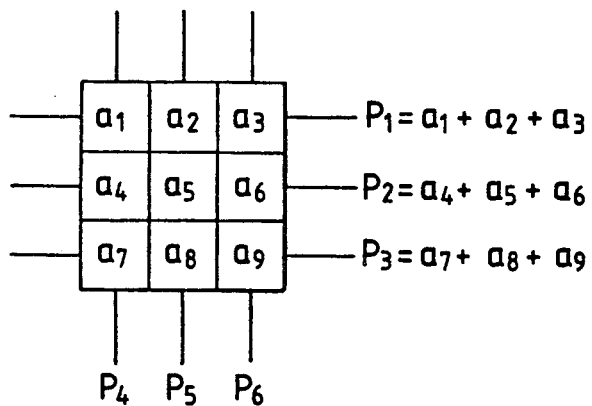
FIG. 4 is a scheme for explaining the principle of a reconstruction method according to the present invention.
Figure 5:
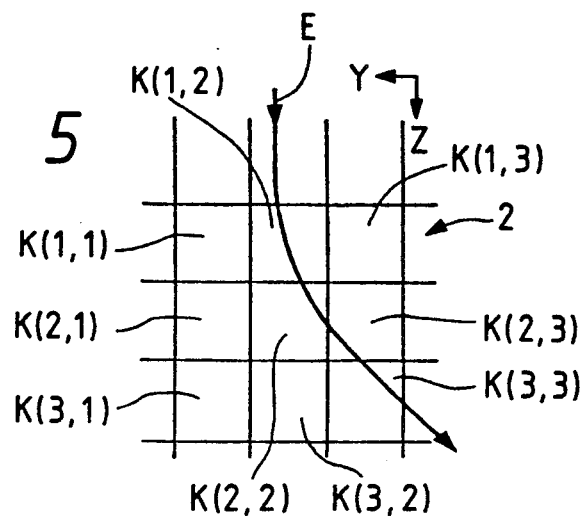
FIG. 5 is a scheme for explaining a method for repeatedly correcting the magnetic field in the same embodiment.

The various parts of the system described above are controlled by a computer for control and processing 17. This computer for control and processing 17 controls the synchronizing circuit 15 (strobo control) so that the output signal 15 is in synchronism with a desired phase state of the high frequency magnetic field in the small spatial region in the neighborhood of the sample 8. In this way, the magnitude of deviation of the electron beam after the passage through the high frequency magnetic field region is measured synchronously (strobo measurement) by the electron beam detector 10. The computer for control and processing 17 calculates the position of the spot in the image on the basis of the image data taken in the frame memory 14 and a two-dimensional magnitude of deviation from the difference between the position of the spot without magnetic field and that obtained with the magnetic field. (B) Principle of the ART (algebraic reconstruction) method The method according to the present invention for reconstructing the magnetic field distribution, starting from the magnitude of deviation of the electron beam, is based on an algebraic method called the ART method. Therefore, next, the principle of the ART method will be explained. FIG. 4 is a scheme for explaining the principle of the ART method. As indicated in this figure, e.g. a matrix of 3 lines and 3 rows is considered, each of the elements of the matrix being represented by $a_i$ (i=1 to 9). At this time, values obtained by adding the elements in the directions of lines, rows and diagonals $P_j$ (j=1 to 8) (peripheral sums) are considered and thus 8 values (equations) are obtained. The ART method is a method, by which, in the case where only these peripheral sums are given, the elements $a_i$ are evaluated inversely from these peripheral sums. By the reconstruction method using the ART method, mathematically it is not always guaranteed that the elements can be determined unequivocally. However, usually, it is possible to achieve a correct solution by repeating the inverse evaluation while correcting repeatedly each of $a_i$. In the case of the electron beam tomography (FIG. 2), the plane to be measured 2 is considered to consist of a number of lattice points. Further, the deviation magnitude data and the intensity of the magnetic field are considered to correspond to the peripheral sums $P_j$ and the elements $a_i$ of the matrix, respectively. The magnetic field is inversely evaluated by this method. However, the peripheral sums are obtained, taking into account that electrons fly, in general, tracing curved trajectories in the magnetic field (described later). (C) Algorithm for reconstructing the magnetic field distribution Next the algorithm for reconstructing the magnetic field distribution, to which the ART method described above is applied, will be described. Here, for the sake of simplicity, only one plane to be measured 2 is considered. As indicated in FIG. 1, this reconstructing algorithm consists of several processes such as setting of the initial value (Step SP2), calculating the magnitude of deviation (Step SP3), convergence judgment (Step SP4), repeated corrections of magnetic field (Step SP5), etc. Hereinbelow each of the processes will be explained.

(1) Setting of initial value

At first, the setting of the initial value of the magnetic field will be described. In the case where the magnetic field distribution is reconstructed on the plane to be measured (reconstruction plane) by using the ART method, in general, the initial value of the magnetic field may be selected in any way. However, in the measuring that the number of repeated corrections of the magnetic field is reduced and that the plausibility of the obtained solution is secured, it is preferable to select a value close to a true value as the initial value. From such a point of view, in this embodiment, the initial value is set by a method described below.

When the average value of the magnetic field is calculated by an algorithm identical to that of the Lorenz method, starting from the deviation magnitude data measured from a certain incident (projection) direction (e.g. k direction) of the electron beam E, e.g. the average value $B_{xk}(i_k, j_k)$ of the X direction component of the magnetic field at a lattice point specified by (m,n) is given by Equation (1);

$$B_{xk}(i_k, j_k) = \frac{-mV_o}{eN'L_rL_s} D_{yk}(i_k) \quad (1)$$

where $D_{yk}(i_k)$ is the measured value of the magnitude of deviation m is the electron mass, e is the electron charge, N' is the number of lattice points on one side of a rectangular region, for which the reconstruction should be effected, $L_s$ is the distance from the center of the sample to the plane to be measured, and $L_r$ is the interval between adjacent two lattice points.

When the average values given by Equation (1) for all the incident (projection) directions (k=1 to k) are added and the average thereof is formed, Equation (2) is obtained;

$$B_x(m, n) = \frac{1}{K'(m, n)} \Sigma Map\{B_{xk}(i_k, j_k)\} \quad (2)$$

where $\Sigma$ is the total sum, when k runs from 1 to k, $M_{ap}\{\ldots\}$ is the interpolation accompanied by the rotation of the coordinate system, K'(m,n) is the number of superpositions of the reconstruction domain accompanied by the rotation.

However, when the final average value is formed, distortions of the lattice points accompanied by the rotation of the coordinate system are corrected. The Y direction and the Z direction component of the magnetic field are obtained by a similar process.

(2) Calculation of magnitude of deviation

Using the initial value of the magnetic field distribution obtained in the preceding paragraph, the trajectories of electrons in the magnetic field are calculated numerically under the incident conditions identical to those used when the magnitude of deviation of the electron beam E has been obtained by the measurement and the magnitude of deviation (vector) of the electron beam E is calculated. However, at the trajectory calculation it is supposed that all of the components in the X, Y and Z directions are uniform with respect to the X direction. That is, in the case where the electron beam E is deflected by the magnetic field and deviated from the reconstruction plane, the trajectory calculation is effected by using the magnetic field in the corresponding lattice points, when the electron trajectory is projected on the reconstruction plane (plane to be measured 2). Further the calculation of the magnitude of deviation is effected not only in the case described above, but also it is effected by using the corrected magnetic field distribution, every time the correcting processing of the magnetic field described later is repeated.

(3) Convergence judgment

When the process of calculating the magnitude of deviation is terminated, the convergence judgment processing is effected. In this convergence judgment processing, the difference between the result of the calculation of the magnitude of deviation (magnitude of deviation obtained by the numerical calculation) and the measurement result of the magnitude of deviation (magnitude of deviation obtained by the measurement) (hereinbelow residual magnitude of deviation) is obtained. If there exists a residual magnitude of deviation, it is judged whether this residual magnitude of deviation is below a predetermined reference value or not.

(4) Repeated corrections of magnetic field

In the process of the repeated corrections of the magnetic field, in the case where it is found as the result of the convergence judgment that the residual magnitude of deviation exceeds the reference value, the magnetic field at each of the lattice points is corrected so that this residual magnitude of deviation is uniformly shared along the electron trajectory. However, since the length of the electron trajectory passing through the different elements of the lattice G(1,1), G(1,2), . . . , G(3,3) differs from each other, G(1,2), G(2,2), G(2,3), it is necessary to share the residual magnitude of deviation, taking this fact into account. Therefore Equation (3) is used as the repeated correction formula, taking it into account;

$$\delta B_{xk(ik,jk)}{}^{(q)} = W_{k(ik,jk)}{}^{(q)} \frac{-mV_o}{eN^*L_rL_s} \delta D_{yk(ik)}{}^{(q)} \quad (3)$$

where $\delta B_{xk}(ik, jk)$ is the correction value for magnetic field, $\delta D_{yk}(ik)$ is the difference between calculated magnitude of deviation and measured magnitude of deviation, $W_k(ik, jk)$ is the weighting function, q is the number of repeated corrections.

In this way the repeated corrections are effected for all the directions.

(D) Measuring process

Each of the processes of the measuring method in the present embodiment has been explained. Now, the flow of the measuring method in the present embodiment will be explained as a whole, referring to FIG. 1. At first, in Step SP1, the measurement of the magnitude of deviation of the electron beam E after the passage through the high frequency magnetic field domain (strobo measurement) is effected. In Step SP2, the setting of the magnetic field distribution is effected on the basis of the result of measurement on the magnitude of deviation of the electron beam E. In Step SP3, the calculation of the electron trajectory is carried out by using the initial value of the set magnetic field distribution to obtain the magnitude of deviation. In Step SP4, the convergence judgment is effected. That is, the residual magnitude of deviation is obtained and the judgment is effected whether the obtained residual magnitude of deviation is below the reference value or not. When the result of this judgment is "NO", i.e. when the residual magnitude of deviation exceeds the reference value, the procedure proceeds to Step SP5. After having effected the correction of the magnetic field, the procedure returns to Step SP3 and the calculation of the electron trajectory is effected again by using the evaluated magnetic field after the correction to obtain the magnitude of deviation. In this way, the correction of the magnetic field (Step SP5) and the calculation of the magnitude of deviation (Step SP3) are repeated, until the judgment result "YES" is obtained in Step SP4. When the judgment "YES" is obtained as the result of the repeated execution of the processing described above in Step SP4, the whole processing is terminated, supposing that the magnetic field distribution evaluated at this point of time represents a solution for the magnetic field distribution.

(E) Evaluation of reconstruction algorithm

The reconstruction algorithm according to the present invention was evaluated by computer simulation. Hereinbelow it will be described in detail.

Figure 6:
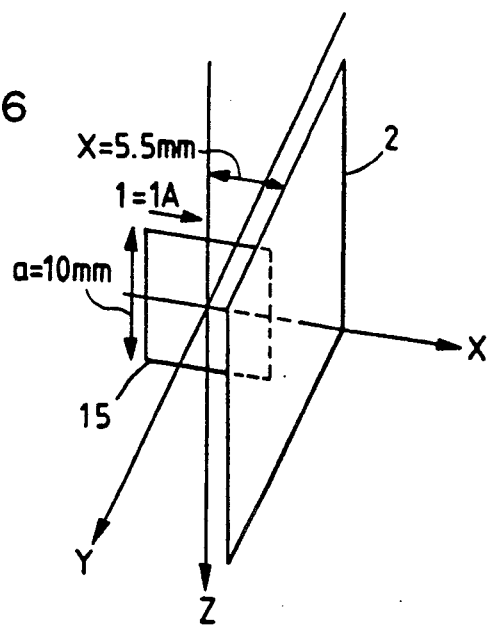
FIG. 6 shows a computer simulation model.

FIG. 6 is a scheme illustrating a model for the computer simulation. In this figure, reference numeral 15 represents a rectangular one-turn coil, whose one side is 10mm long, which is the model for the computer simulation. In this simulation, a case where an AC current having a frequency of 10MHz and an effective current of 1A flows through the rectangular one-turn coil 15 is considered. The rectangular one-turn coil 15 is so arranged that the center thereof is located at the origin of the XYZ coordinate system and that all the sides are on the XZ plane. The plane to be measured 2 is located so as to be at 5.5mm measured from the center of the rectangular one-turn coil 15, i.e. at 0.5mm measured from the closest side of the coil. The magnetic u potential function $\Omega(X,Y,Z)$ of the rectangular one-turn coil 15 is given by Equation (4) and the components BX, BY and BZ of the magnetic field are obtained by Equation (5):

$$\Omega(X, Y, Z) = \quad (4)$$

$$\frac{\mu_o I}{4\pi} \left[ -\mathrm{Tan}^{-1} \frac{(X + a/2)(Z + a/2)}{Y\sqrt{(X + a/2)^2 + Y^2 + (Z + a/2)^2}} + \right.$$

$$\mathrm{Tan}^{-1} \frac{(X + a/2)(Z - a/2)}{Y\sqrt{(X + a/2)^2 + Y^2 + (Z - a/2)^2}} +$$

$$\mathrm{Tan}^{-1} \frac{(X - a/2)(Z + a/2)}{Y\sqrt{(X - a/2)^2 + Y^2 + (Z + a/2)^2}} -$$

$$\left. \mathrm{Tan}^{-1} \frac{(X - a/2)(Z - a/2)}{Y\sqrt{(X - a/2)^2 + Y^2 + (Z - a/2)^2}} \right]$$

$$BX = -\frac{\partial}{\partial X} \Omega(X, Y, Z) \quad (5)$$

$$BY = -\frac{\partial}{\partial Y} \Omega(X, Y, Z)$$

$$BZ = -\frac{\partial}{\partial Z} \Omega(X, Y, Z)$$

Figure 7A:
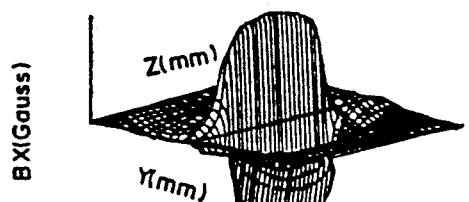
FIGS. 7A(a-c) and 7B(a-c) show magnetic field distributions of a rectangular one-turn coil obtained by the computer simulation.
Figure 7B:
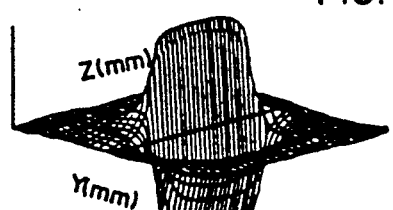
Figure 7A:
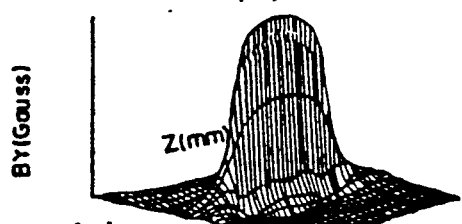
Figure 7B:
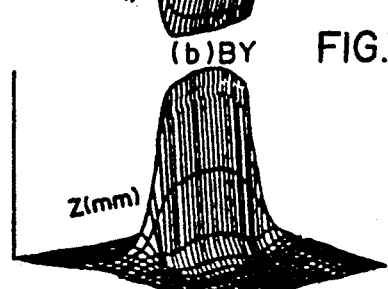
Figure 7A:
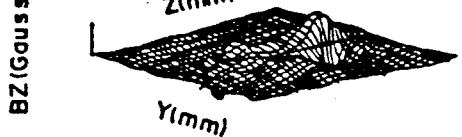
Figure 7B:
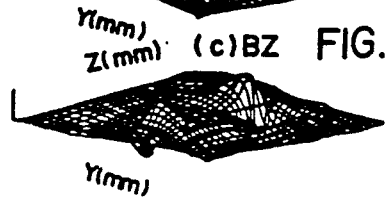

Next, the procedure of the simulation will be explained. At first, instead of the measurement of the magnitude of deviation of the electron beam, using the components BX, BY and BZ of the magnetic field obtained by using Equation (5), the magnitude of deviation is calculated numerically for all the incident (projection) directions according to the procedure as the real measurement of the magnitude of deviation. Next, the original magnetic field distribution is reconstructed by the reconstruction method (Steps SP2 to SP5 in FIG. 1), starting from the data of the magnitude of deviation thus obtained. FIG. 7A shows results of the reconstruction thus obtained, and further for the purpose of comparison, FIG. 7B shows the corresponding theoretical magnetic field distributions obtained by numerical calculations using Equation (5). From FIGS. 7A and 7B, it can be seen that the reconstructed magnetic field distributions are in very good agreement with the theoretical magnetic field distributions. In order to evaluate quantitatively these errors, the normalized absolute average error and the normalized error dispersion were obtained and it has been found that the errors are about 10% by any evaluation method. Further the relation between the number of repetitions in the repeated correction calculation and the reconstruction errors was examined and it has been found that the calculation converges in 4 or 5 repetitions.

(F) Measuring experiment for rectangular one-turn coil

In order to test experimentally the plausibility of the measuring system made by way of trial and the reconstruction algorithm, measuring experiments were effected under the same conditions as those used for the computer simulation for the magnetic field distribution of a rectangular one-turn coil having the same size as that of the rectangular one-turn coil 15 (FIG. 6) used for the model for the computer simulation. FIG. 8A shows reconstruction results obtained by these measuring experiments, and further for the purpose of comparison, FIG. 8B shows the corresponding theoretical magnetic field distributions obtained by numerical calculations using Equation (5). From FIGS. 8A and 8B, it can be seen that the reconstructed magnetic field distributions are in very good agreement with the theoretical magnetic field distributions. In order to evaluate quantitatively these errors, the normalized absolute average error and the normalized error dispersion were obtained and it has been found that the errors are about 10% by any evaluation method, similarly to the case of the computer simulation. In this way it has been found that these experimental results are in good agreement with those obtained by the computer simulation.

(G) Measuring experiment for erasing head

Next, measuring experiments were effected for the leakage high frequency magnetic field of a double gap type erasing head. FIG. 9 is a perspective view indicating the outline of the construction of the double gap type erasing head 16 used in the experiments. The conditions, under which the measurements of the leakage magnetic field of this erasing head 16 are effected, are as indicated in the following table.

| | |
|---|---|
| Accelerating voltage of microscope | 15 kV |
| Exciting current of magnetic head | 10 mA |
| Frequency of exciting current | 10 MHz |
| Position of measurement plane | 300 mm (Z direction) |
| Position of plane to be measured | 0.2 mm (X direction) |
| Number of projection directions | 36 |
| Interval between projection directions | 5° |
| Domain of projection | −85~90° |
| Number of projection | 61 × 61 |
| Interval between lattice points | 0.175 mm |
| Domain of reconstruction | 10.5 × 10.5 mm |

Figure 10A:
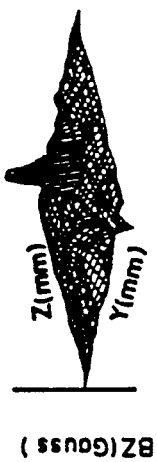
FIGS. 10A(a,b), 10B(a,b) and 10C(a,b) show leakage magnetic field distributions of the erasing head obtained by measuring experiments.
Figure 10B:
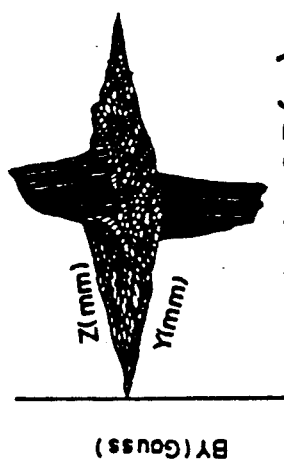
Figure 10C:
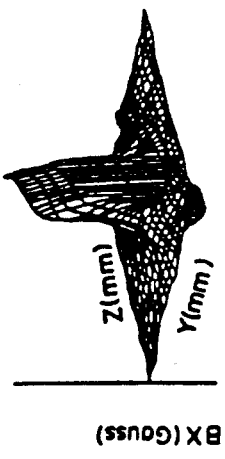
Figure 10A:
Figure 10B:
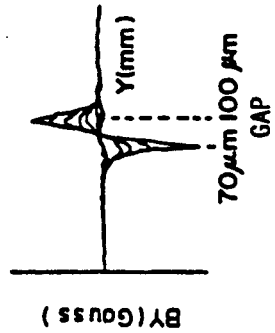
Figure 10C:
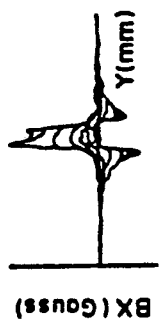

FIGS. 10A, 10B and 10C show results obtained by measuring the magnitude of deviation under these measurement conditions to reconstruct the magnetic field distribution. From these figures, the aspect of the leakage high frequency magnetic field distribution from the two gaps of micron order can be well understood. It was verified therefrom that it is possible to measure the magnetic field distribution in a small spatial domain of micron order.

As explained above, by the method described in this embodiment, it is possible to measure a three-dimensional high frequency magnetic field distribution. Further, since measured values of the magnitude of deviation are compared with calculated values of the magnitude of deviation obtained by numerical calculations by using the inversely evaluated (constructed) magnetic field and the reconstructed magnetic field is repeatedly corrected, until the residual magnitude of deviation becomes satisfactorily small, it is possible to exclude errors produced due to the fact that the electron trajectory is curved. Consequently, the three-dimensional high frequency magnetic field distribution can be measured with a high precision.

Although, in the above embodiment, the case where the plane to be measured is irradiated with a high frequency pulsed electron beam was described, the present invention is not restricted thereto, but the plane to be measured may be irradiated with a continuous electron beam, the detection output of the electron beam detector being synchronized with the high frequency magnetic field.

As explained above, according to the first embodiment, since it is possible to measure the three-dimensional high frequency magnetic field distribution in a small spatial region with a high precision, it is possible to measure dynamic magnetic characteristics of a small magnetic device.

EMBODIMENT 2

Hereinbelow, the second embodiment of the present invention will be explained, referring to the drawings.

FIG. 1 is a flow chart indicating the flow of the method for measuring a three-dimensional spatial magnetic field distribution, which is identical to that described in the first embodiment. Since the measuring method is identical to that of the first embodiment, detailed explanation thereof will be omitted.

(A) Measurement of magnitude of deviation

At first, the method for measuring the magnitude of deviation of the electron beam according to the present embodiment will be explained.

FIG. 2 is a scheme indicating the principle of the three-dimensional measuring method (principle of the electron beam tomography), which is identical to that described in the first embodiment and detailed explanation thereof will be omitted.

Figure 11:
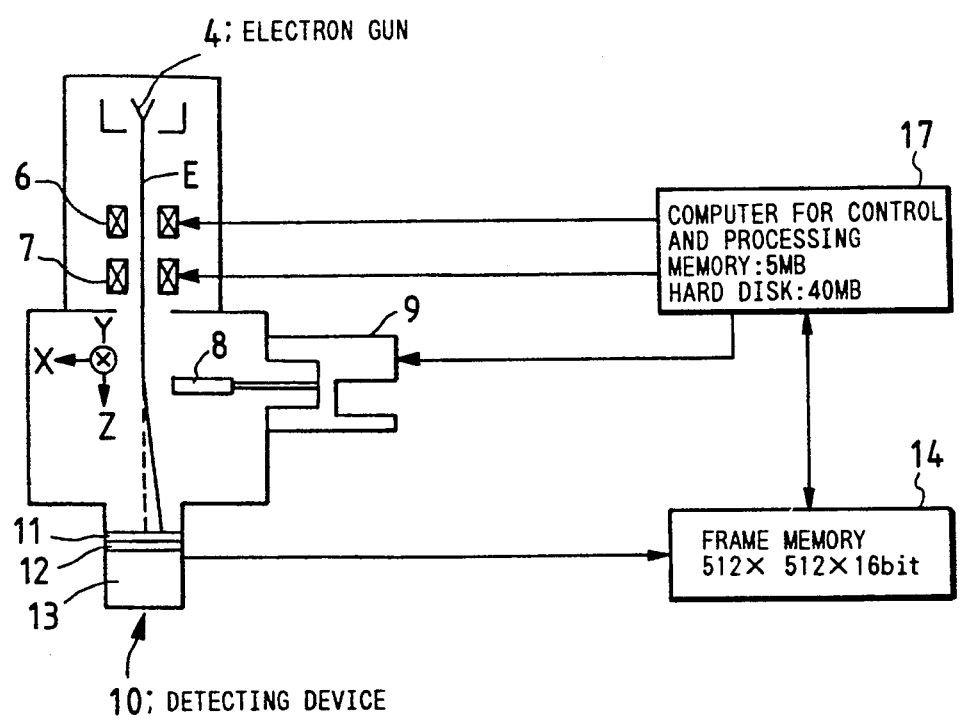
FIG. 11 is a scheme indicating the outline of the construction of a measuring system applied to a second embodiment of the present invention.

FIG. 11 is a scheme indicating the outline of the construction of a measuring system applied to the three-dimensional measuring method in this second embodiment, in which the portions or parts identical to those indicated in the first embodiment are represented by the same reference numerals. In the figure, reference numeral 4 is an electron gun emitting the electron beam E; 6 is a deflecting coil which deflects the electron beam E in the X direction; 7 is a deflecting coil which deflects the electron beam E in the Y direction; 8 is a sample such as a magnetic head; and 10 is an electron beam detector for measuring the magnitude of deviation of the electron beam. This electron beam detector 10 is composed of an MCP (microchannel plate) 11, a fluorescent plate 12 and an SIT camera 13 (high sensitivity television camera). The MCP 11 is an assembly of photomultipliers. When the electron beam is injected therein, electrons are multiplied and projected to the fluorescent plate 12 located under an amplified electron image to produce a spot. Further, the spot is imaged by the SIT camera 13 (high sensitivity television camera) and taken in a frame memory 14 as image data. 17 is a computer for control and processing, which controls various parts of the system and executes various processings according to a predetermined program. This computer for control and processing 17 calculates the position of the spot in the image on the basis of the image data taken in the frame memory 14 and a two-dimensional magnitude of deviation from the difference between the position of the spot without magnetic field and that obtained with the magnetic field. 9 is a four-axis fine movement device, which rotates and translates parallelly the sample 8. This four-axis fine movement device 9 is constructed so as to be controlled by the computer for control and processing 17. As described above, the principal part of the measuring system applied to the present embodiment is a scanning type electron microscope.

(B) Principle of the ART (algebraic reconstruction) method

The method according to the present invention for reconstructing the magnetic field distribution, starting from the magnitude of deviation of the electron beam, is based on an algebraic method called the ART method. FIG. 4 is a scheme for explaining the principle of the ART method. Since the principle of the ART method was explained in the first embodiment, explanation thereof will be omitted.

(C) Algorithm for reconstructing the magnetic field distribution

Since the algorithm for reconstructing the magnetic field distribution, to which the ART method described above is applied, is identical to that described in the first embodiment, it will be omitted.

Next, the measuring procedure in the second embodiment will be explained below.

(D) Measuring process

Each of the processes of the measuring method in the present embodiment has been explained. Now, the flow of the measuring method in the present embodiment will be explained as a whole, referring to the FIG. 1. At first, in Step SP1, the measurement of the magnitude of deviation of the electron beam E after the passage through magnetic field domain is effected. In Step SP2, the setting of the magnetic field distribution is effected on the basis of the result of measurement on the magnitude of deviation of the electron beam E. In Step SP3, the calculation of the electron trajectory is carried out by using the initial value of the set magnetic field distribution to obtain the magnitude of deviation. In Step SP4, the convergence judgment is effected. That is, the residual magnitude of deviation is obtained and the judgment is effected whether the obtained residual magnitude of deviation is below the reference value or not. When the result of this judgment is "NO", i.e. when the residual magnitude of deviation exceeds the reference value, the procedure proceeds to Step SP5. After having effected the correction of the magnetic field, the procedure returns to Step SP3 and the calculation of the electron trajectory is effected again by using the evaluated magnetic field after the correction to obtain the magnitude of deviation. In this way, the correction of the magnetic field (Step SP5) and the calculation of the magnitude of deviation (Step SP3) are repeated, until the judgment result "YES" is obtained in Step SP4. When the judgment "YES" is obtained as the result of the repeated execution of the processing described above in Step SP4, the whole processing is terminated, supposing that the magnetic field distribution evaluated at this point of time represents a solution for the magnetic field distribution.

(E) Evaluation of reconstruction algorithm

The reconstruction algorithm according to the present invention was evaluated by computer simulation. Since the detail thereof is identical to that described in the first embodiment, explanation thereof will be omitted.

(F) Measuring experiment for rectangular one-turn coil

Similar to the first embodiment, in order to test experimentally the plausibility of the measuring system made by way of trial and the reconstruction algorithm, measuring experiments were effected under the same conditions as those used for the computer simulation for the magnetic field distribution of a rectangular one-turn coil having the same size as that of the rectangular one-turn coil 15 (FIG. 6) used for the model for the computer simulation. Since experimental results identical to those described in the first embodiment were obtained, explanation thereof in detail will be omitted.

(G) Measuring experiment for erasing head

Next, measuring experiments were effected for the leakage magnetic field of a double gap type erasing head. Since experimental results identical to those described in the first embodiment were obtained, explanation thereof in detail will be omitted.

As explained above, by the method described in this embodiment, since measured values of the magnitude of deviation are compared with calculated values of the magnitude of deviation obtained by numerical calculations by using the inversely evaluated (reconstructed) magnetic field and the reconstructed magnetic field is repeatedly corrected, until the residual magnitude of deviation becomes satisfactorily small, it is possible to exclude errors produced due to the fact that the electron trajectory is curved.

Further, if the reconstruction is effected by using a greater number of planes to be measured, which are parallel to each other, and at the same time, a higher accelerating voltage for the electron beam is applied it is possible to improve the measurement precision for the magnetic field distribution and to increase further the intensity of the magnetic field to be measured.

As explained above, according to the present invention, since it is possible to exclude measurement errors due to non-linear trajectories of the electron beam, an advantage can be obtained that measurements can be effected with a precision substantially higher than that obtained by the prior art method.

What is claimed is:

1. A method for measuring three-dimensional spatial magnetic field distribution comprising the steps of:
   (a) selecting a reference axis in a measurement space in which the magnetic field distribution is to be measured and wherein several planes to be measured are set in said measurement space which are perpendicular to said reference axis;
   (b) successively scanning an electron beam in each of said planes to be measured with predetermined various incident angles and successively measuring the magnitude of deviation of the electron beam due to the action of the magnetic field distributed in each of said planes to be measured;
   (c) algebraically reconstructing the magnetic field distributed in each of said planes to be measured on the basis of the corresponding measured magnitude of deviation;
   (d) calculating the trajectory of said electron bean to obtain a calculated magnitude of deviation corresponding to each of said successive measured magnitudes of deviation;
   (e) calculating the difference in the calculated magnitude of deviation of said electron beam and the corresponding measured magnitude of deviation of said electron beam; and
   (f) correcting the reconstructed magnetic field on the basis of said difference, until said difference is decreased below a value previously set.

* * * * *